(12) United States Patent
Nilsen et al.

(10) Patent No.: US 8,124,179 B2
(45) Date of Patent: Feb. 28, 2012

(54) THIN FILMS PREPARED WITH GAS PHASE DEPOSITION TECHNIQUE

(75) Inventors: Ola Nilsen, Oslo (NO); Helmer Fjellvag, Oslo (NO)

(73) Assignee: Universitetet I Oslo, Oslo (NO)

( * ) Notice: Subject to any disclaimer, the term of this patent is extended or adjusted under 35 U.S.C. 154(b) by 1226 days.

(21) Appl. No.: 11/722,937

(22) PCT Filed: Dec. 28, 2005

(86) PCT No.: PCT/NO2005/000488
§ 371 (c)(1),
(2), (4) Date: Jun. 27, 2007

(87) PCT Pub. No.: WO2006/071126
PCT Pub. Date: Jul. 6, 2006

(65) Prior Publication Data
US 2008/0102313 A1    May 1, 2008

(30) Foreign Application Priority Data
Dec. 28, 2004   (NO) .................................... 20045674

(51) Int. Cl.
*C23C 16/00* (2006.01)
*B05D 1/36* (2006.01)
(52) U.S. Cl. ............... 427/248.1; 427/255.7; 427/255.6; 427/402
(58) Field of Classification Search ........................ None
See application file for complete search history.

(56) References Cited

U.S. PATENT DOCUMENTS

| | | |
|---|---|---|
| 5,693,139 A | 12/1997 | Nishizawa et al. |
| 6,400,489 B1 | 6/2002 | Suzuki et al. |
| 6,752,869 B2 | 6/2004 | Lee et al. |
| 7,407,895 B2 * | 8/2008 | Kunitake et al. ............... 438/785 |
| 2002/0048635 A1 * | 4/2002 | Kim et al. ..................... 427/331 |

OTHER PUBLICATIONS

D.B. Mitzi; K. Chondroudis; C.R. Kagan, "Organic-Inorganic Electronics", IBM J. Res. & Dev., Jan. 2001, vol. 45, No. 1, 21-45.
David B. Mitzi, "Thin-Film Deposition of Organic-Inorganic Hybrid Materials", Chem. Mater., 2001, 13, 3283-3298.
M. Ritala; M. Leskela, "Handbook of Thin Film Materials", H.H. Nalwa (Ed), 2001, vol. 1, 103-159, Academic Press, San Diego, CA.

* cited by examiner

*Primary Examiner* — Sheeba Ahmed
(74) *Attorney, Agent, or Firm* — Volpe and Koenig, P.C.

(57) ABSTRACT

A process for the preparation of thin films of an organic-inorganic nature comprising growing with a gas phase deposition technique preferable the ALCVD (atomic layer chemical vapour deposition) technique. As an example, trimethylaluminium (TMA), hydroquinone (Hq) and phloroglucinol (PhI) have been used as precursors to fabricate thin films of aluminium benzene oxides constructing a hybrid type film. Further thin films with a hybrid nature are described. These films can be used as an optical material, a pressure sensor, a gas sensor, temperature sensor, magnetic field sensor, electric field sensor, a piezoelectric material, a magnetic material, a semiconductor material and as an electric insulating material.

24 Claims, 7 Drawing Sheets

THIN FILMS PREPARED WITH GAS PHASE DEPOSITION TECHNIQUE

The present invention relates to a process for preparation of thin films of an organic-inorganic nature, a thin film, substrates comprising the thin film, the use of the thin film and a pressure sensor comprising the thin film.

ALCVD (=atomic layer chemical vapour deposition, also known as ALE=atomic layer epitaxy, and ALD=atomic layer deposition) is a thin film technique that utilizes only surface reactions, and is described in prior art, see e.g. M. Ritala, M. Leskelä, in: H. S. Nalwa (Ed.), Handbook of Thin Film Materials, vol. I, Academic Press, San Diego, Calif., 2001, p. 103.

It has now surprisingly been found that this technique can be utilized to construct hybrid thin films using different types of precursors. The precursors are pulsed sequentially is into the reaction chamber where it reacts with all surfaces present; each pulse is followed by a purging time with an inert gas. In this way gas phase reactions are eliminated and film is constructed by precursor units in the order that they are pulsed. This technique makes it possible to change building units at the resolution of one monolayer, and therefore enables production of artificial structures of hybrid films with different types of organic and inorganic building units.

A hybrid material is a material which consists of both inorganic and organic building units. This class of material has recently gained much focus due to the fact that it is now possible to synthesize these materials in a more controlled manner. The inorganic moiety may offer potential advantages such as good electrical mobility, band gap tuneability, mechanical and thermal stability, and interesting magnetic or dielectric transitions. Meanwhile, the organic moiety may offer useful properties such as soft mechanical properties, convenient processing, as well as structural and functional diversity. In view of the synthetic flexibility of organic materials, this latter set of possibilities is particularly moving for the imagination. These advantages are discussed thoroughly in prior art, e.g. by Z. Xu, in Inorganic Chemistry, Vol. 42, No. 6, 2003 or D. B. Mitzi, Progress in Inorganic Chemistry, 48 (1999) 1-121. and D. B. Mitzi in Chemistry of Materials 13 (2001) 3283-3298. David B. Mitzi has focused his attention on hybrid materials for transistor materials. This is with the basis in the perovskite amine type hybrid materials. Known techniques for producing hybrid materials are: co-evaporation (PVD), spin coating, dip coating. Langmuir film growth, regular CVD. Another publication within this field is D. B. Mitzi et al, "Organic-inorganic electronics", IBM J. Res. & Dev. Vol. 45 NO. 1, January 2001, page 21-45. Here organic-inorganic hybrid materials and their uses are described. The use of ALCVD technique to obtain hybrid materials is not described.

In hybrid multilayer films formed by the self-assembly of an ordered liquid crystalline array of molecular columns on an ultra-thin metal layer, it has been shown that electrons in the metal interact with the molecular overlayer, forming new energy bands which have novel electron transport properties. See e.g. A. Pecchia et al./Microelectronic Engineering 51-52 (2000) 633-644.

Hybrid films may also have interesting optical properties, e.g. as described for polysilane-silica hybrid thin films by S. Mimura et al in Journal of Organometallic Chemistry 611 (2000) 40-44.

Due to the large number of possible organic and inorganic building units that may be imagined used in hybrid materials, there is an almost unlimited imagined outcome in possible interesting properties that may be produced from hybrid materials. Some of these constructions may involve superstructures of different hybrid materials, and this should be conveniently possible to produce by ALCVD. It is the hope that this field may benefit the next generation of electronics. The motivation of this work has been to demonstrate that hybrid materials can be synthesized in an easy manner and with good control with the ALCVD technique. It demonstrates the use of chemical reactions to connect different building units that together form a hybrid film.

U.S. Pat. No. 6,645,882B1 describes the construction of dielectric material for semiconductor devices by using multilayers of materials with varying dielectric constants. All materials considered are to be regarded as inorganic materials. This resulting stack is sometimes referred to as a composite or hybrid materials since it consists of materials from two different sub-groups; in this case, inorganic materials with varying magnitude of the dielectric constant. The mentioned patent does not cover any topic in the current invention since the latter focuses on materials that contain both inorganic and organic parts, and as mentioned the patent only focuses on inorganic materials.

US 2004/0087101A1 describes the construction of capacitors by usage of multilayers of materials with varying dielectric constants. In the same way as for U.S. Pat. No. 6,645,882B1, this patent use the formulation artificial hybrid lattices to describe materials from two different sub-groups. Also for this patent, both sub-groups are to be considered as purely inorganic in nature.

US2004/0118805A1 describes methods for etching/removal of material during manufacturing of electronic devices. The technique uses a combination of ion bombardment on selected areas following a wet etching procedure. This combination of two different etching procedures to produce an etching procedure is referred to as a hybrid material removal scheme. The patent is therefore not of any significant importance with respect to this invention.

The ALCVD technique has now been used for the first time to produce thin films of an inorganic-organic nature also refer to as hybrid film.

Accordingly the present invention provides a process for preparation of a thin film of an organic-inorganic nature on a substrate by gas phase deposition technique comprising the following steps:

a) contacting the substrate with a pulse of an inorganic precursor selected from a group consisting of metal alkyls, metal cycloalkyls, metal aryls, metal amine, metal silylamine, metal halogenides, metal carbonyls and metal chelates, where the metal is selected from the group comprising Al, Si, Ge, Sn, In, Pb, alkali metals, alkaline earth metals, 3d-insertion metals, 4d-insertion metals, 5d-insertion metals, lanthanides and actinides;

b) reacting the inorganic precursor with at least one surface of the substrate;

c) removing non-reacted inorganic precursor and reaction by-products if any;

d) contacting the reacted inorganic precursor bound to the surface of said substrate with a pulse of an organic precursor; where the organic precursor is an organic compound with at least two reactive substituents selected from the group comprising —OH, —OR, =O, —COOH, —SH, —SO$_4$H, —SO$_3$H, —PH$_2$, —PO$_4$H, —PO$_3$H, —PRH, —NH$_2$, —NH$_3$I, —SeH, —SeO$_3$H, —SeO$_4$H, —TeH, —AsH$_2$, —AsRH, —SiH$_3$, —SiRH$_2$, —SiRR'H, —GeH$_3$, —GeRH$_2$, —GeRR'H, amine, alkyl amine, silated amine, halogenated amine, imide, azide and nitroxyl; where R and R' may be a C$_{1-10}$ aryl, alkyl, cycloalkyl, alkenyl or alkynyl group;

e) reacting the organic precursor with the inorganic compound bound to the substrate to form an organic inorganic hybrid layer;

f) removing non-reacted organic precursor and reaction by-products if any;

g) repeating step a) to f) until the wanted film thickness is achieved.

The steps a) to c) and/or d) to f) may be repeated with independently chosen precursors before the process continues with the steps d) to f) or a) to c) respectively.

Further the present invention provides a thin film, comprising hybrid monolayers comprising an organic moiety and an inorganic moiety chemically bound to each other.

The invention also provides a substrate comprising a thin film coating containing monolayers comprising an organic moiety and an inorganic moiety chemically bound to each other.

In another aspect the invention provides the use of a thin film produced by the process according to the invention or a thin film according to the invention as an optical material, a pressure sensor, a gas sensor, temperature sensor, magnetic field sensor, electric field sensor, a piezoelectric material, a magnetic material, a semiconductor material and as an electric insulating material.

The invention also provides a pressure sensor characterised by comprising a hybrid thin film produced by ALCVD.

Further the invention provides a thin film comprising several hybrid monolayers of organic and inorganic moieties chemically bound to each other, where the thin film comprises at least two different organic or inorganic moieties.

Other preferred embodiments of the present invention are described in the sub claims.

In the present invention the term "inorganic precursor" is considered to mean any compound comprising an inorganic moiety, which by reaction: with a surface of a substrate is bound to the surface, thereby connecting the inorganic moiety to the substrate through a bond or one or more bridging elements and where the inorganic moiety bound to the surface comprises one or more reactive groups for reaction with a different precursor. By the term "inorganic moiety" is meant a moiety that contains at least one metal atom. For instance it may be a compound that is metal organic, organometallic, a halogen compound, carbonyl or any other compound that is able to bring the metal into the gas phase.

In the present invention the term "organic precursor" is considered to mean any compound comprising an organic moiety, which by reaction with a surface of a substrate is bound to the surface, thereby connecting the organic moiety to the substrate through a bond or one or more bridging elements and where the organic moiety bound to the surface comprises one or more reactive groups for reaction with a different precursor.

Figure 1:
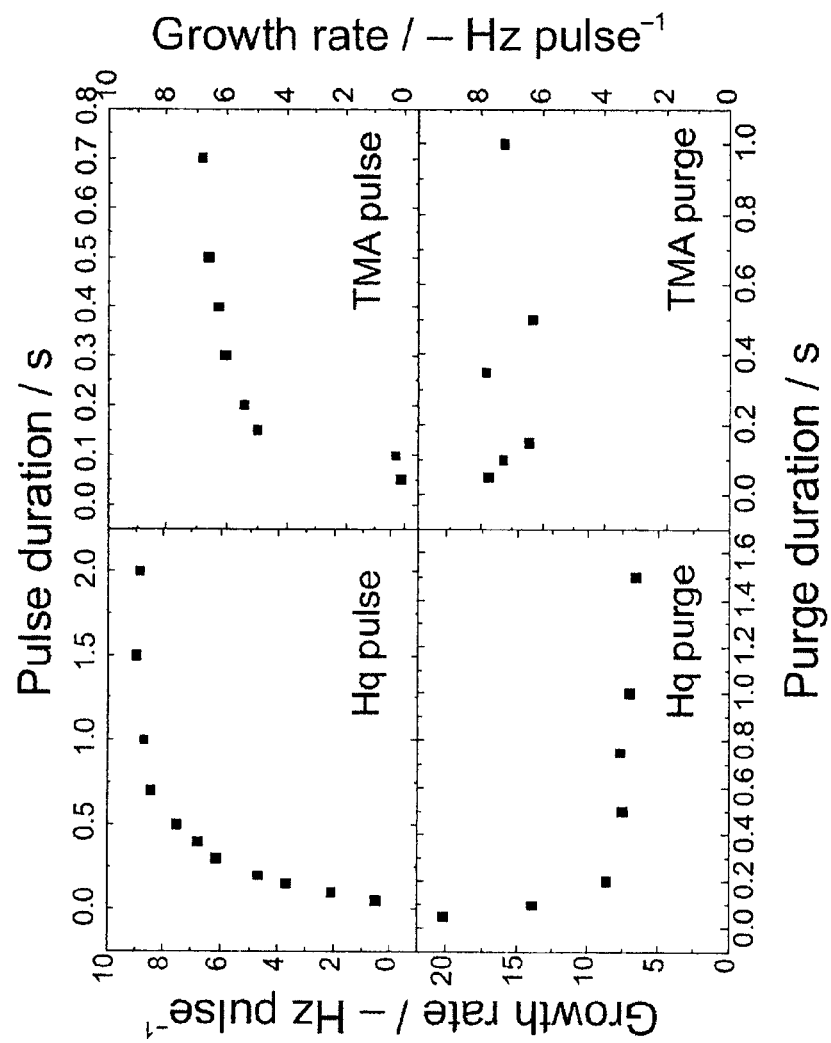
FIG. 1. Effect of pulse parameters on the growth rate of Al-hydroquinone (Hq) films, calculated on the basis of quarts crystal monitor (QCM) measurements.
Figure 2:
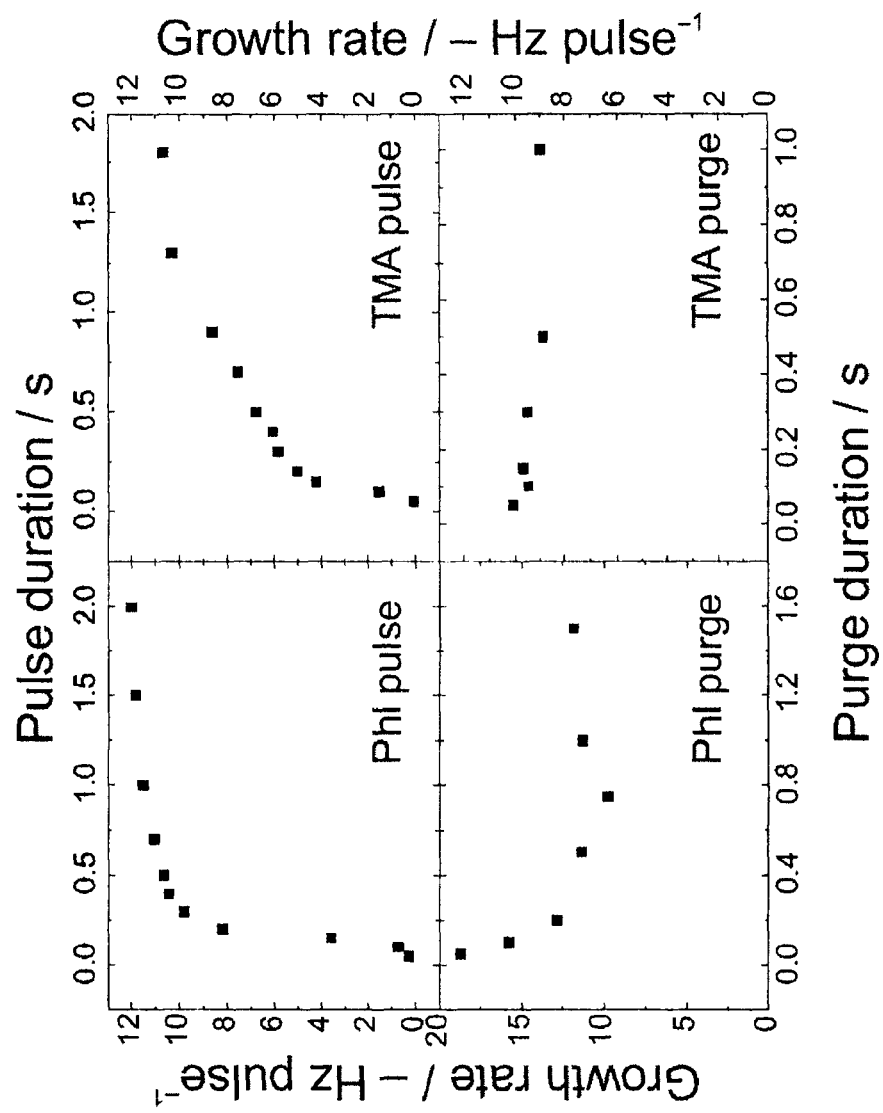
FIG. 2. Effect of pulse parameters on the growth rate of Al-phloroglucinol (Phl) films, calculated on the basis of QCM measurements.
Figure 3:
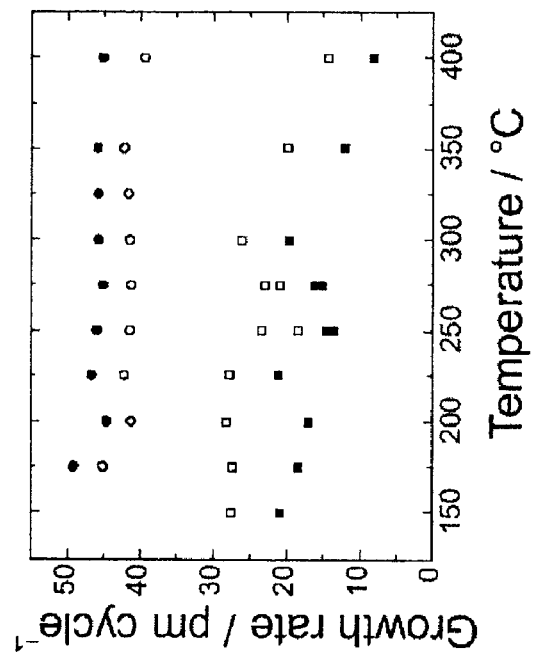
FIG. 3. Growth rate as a function of temperature for Al-Hq (lower pair) and Al-Phl (upper pair) films calculated on the basis of 80 growth cycles, both for as-deposited and air-treated films.
Figure 4:
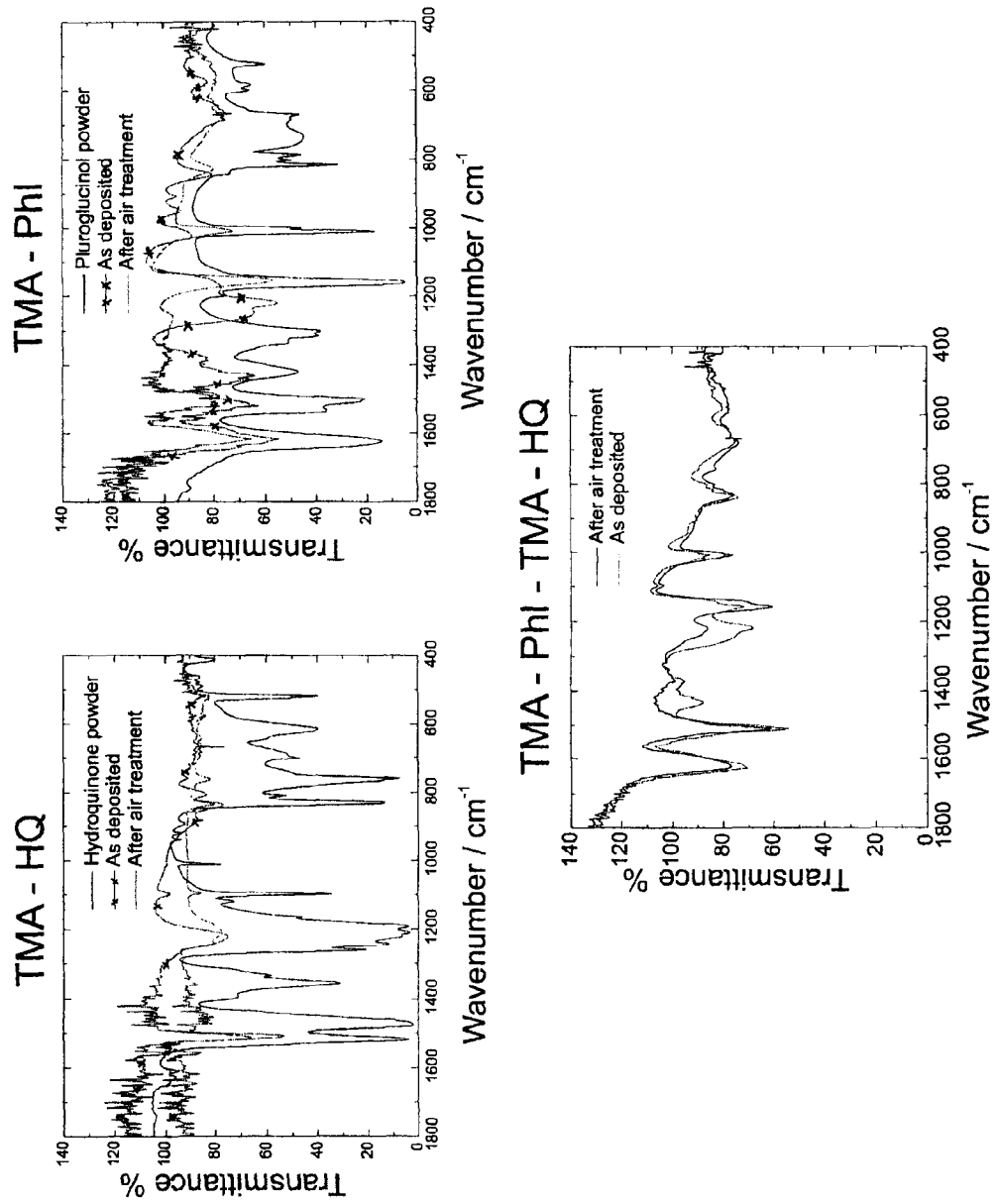
FIG. 4. IR absorbance spectra of thin films of (a) Al-Hq, (b) Al-Phl, (c) Al-Hq-Al-Phl, both as-deposited and air treated. The films were grown with 1000 cycles at a reactor temperature of 200° C. The absorbance spectra for pure Hq and Phl are added as reference.
Figure 5:
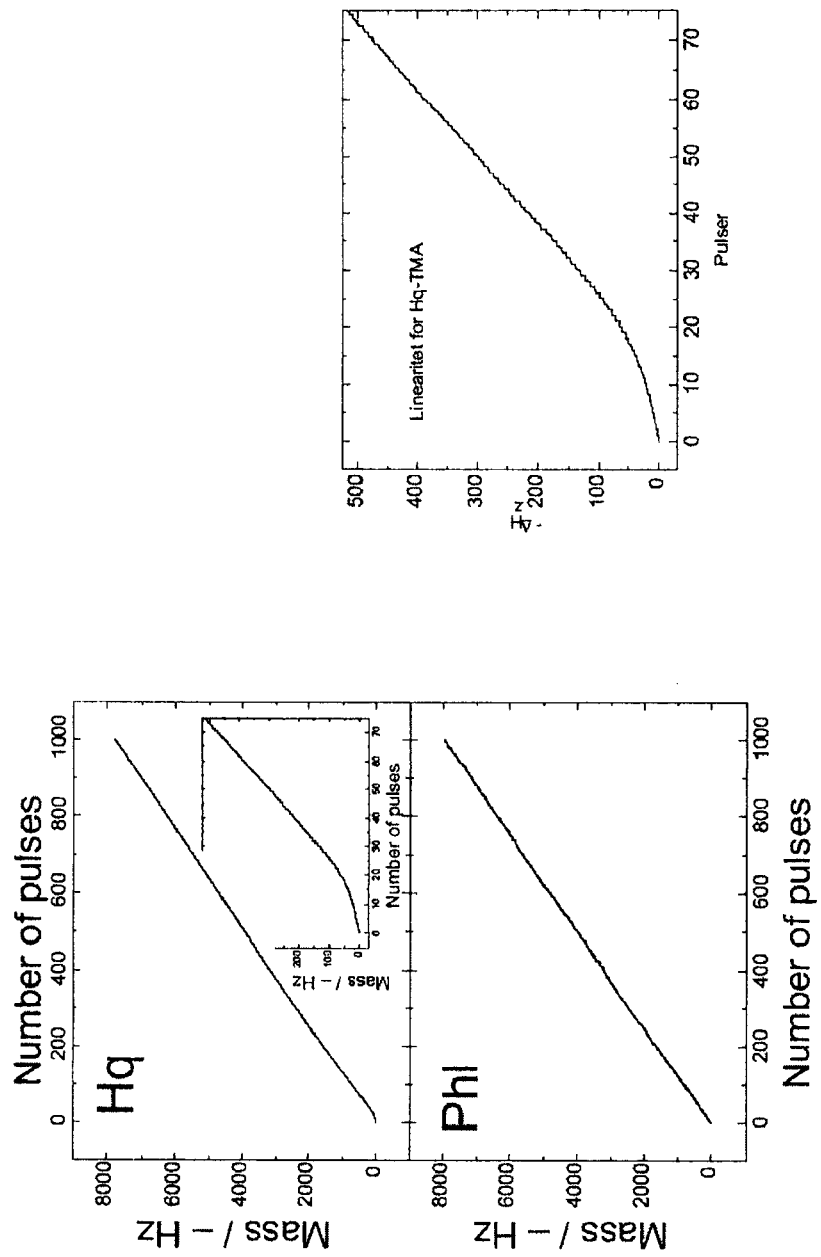
FIG. 5. The linearity of growth as measured by QCM with fresh Au electrodes.
Figure 6:
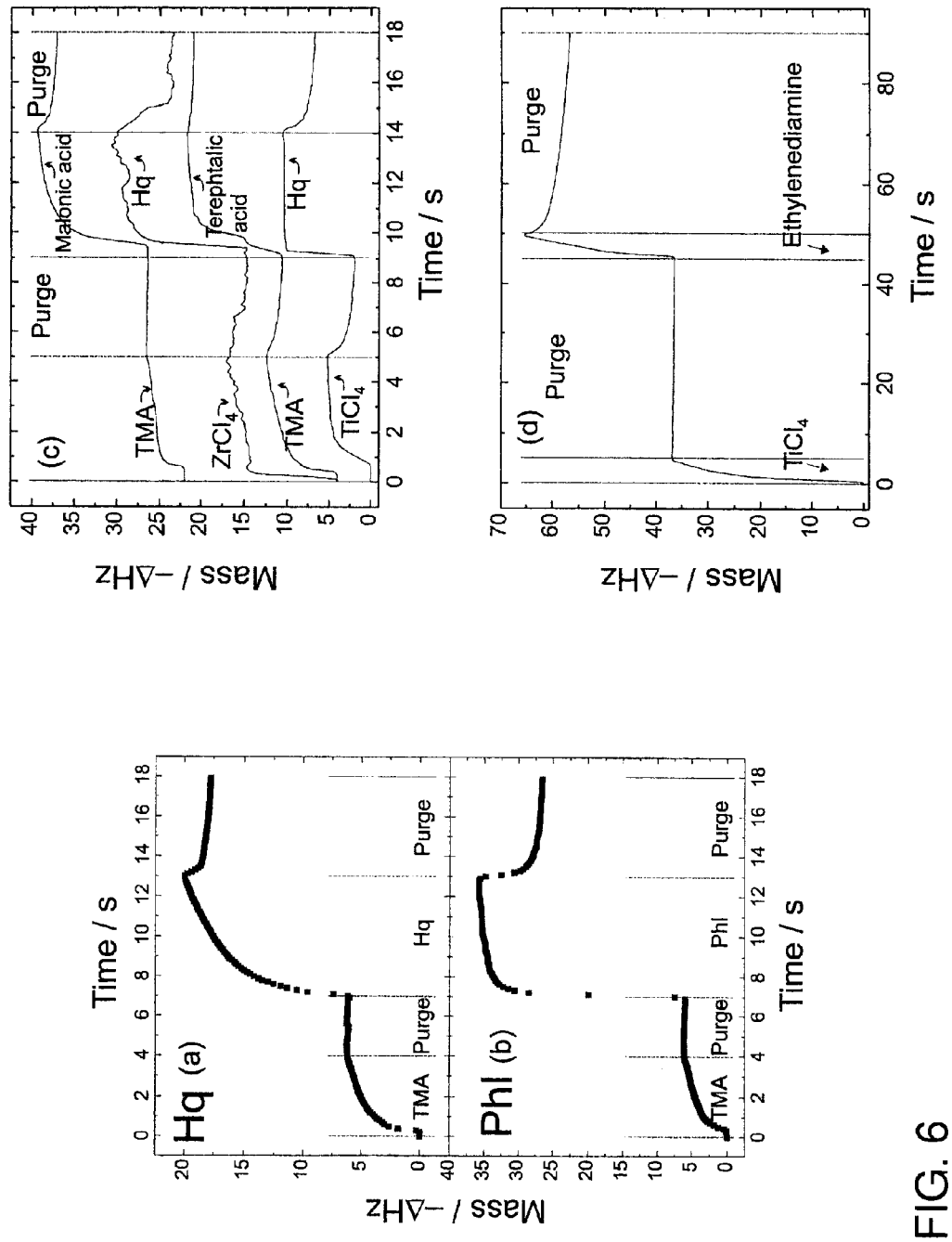
FIG. 6. Growth kinetic analysis acquired by QCM measurements of (a) Al-Hq, (b) Al-Phl, (c) Al-malonic acid, Al-terephtalic acid, Zr-Hq, Ti-Hq, and (d) Ti-Ethylenediamine growth. The data is based on the average of 20 successive pulses.
Figure 7:
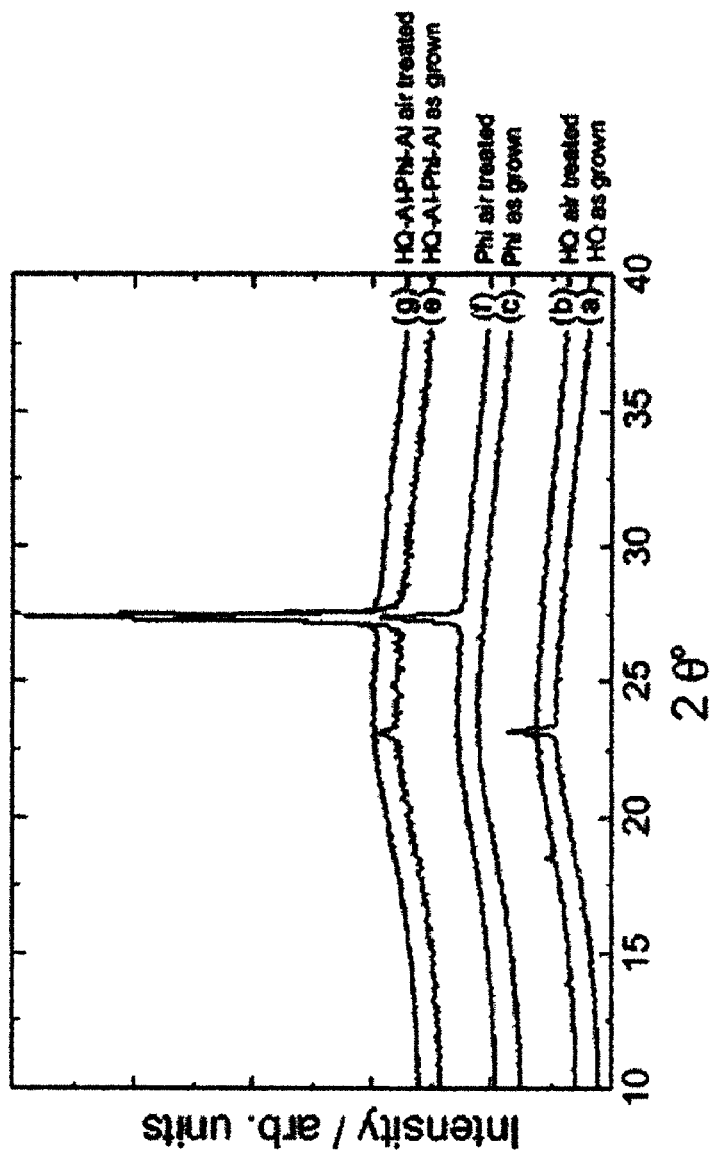
FIG. 7. X-ray diffractograms of hybrid thin films grown with a total of 1000 cycles. The upper and lower diffractograms of each pair represents the as-grown and air treated states, respectively.

The ALCVD technique can be viewed as a controlled sequential chemical reaction technique. The film is built by letting a functional group on a gas molecule react with a suitable site on a surface. The gas molecules that react must leave a site on the surface that will function as a reactive site for a following type of gas molecules in order to produce a continuous film.

This type of growth is exemplified in the growth of Al-Hq and Al-Phl films in the fact that methyl groups attached to aluminium react with hydroxyl groups to form methane and a film of aluminium benzene oxide. The trimethyl-aluminium (TMA) does not react all of its three alkyl groups with the surface due to steric hindrance, but keeps at least one group as a reactive site towards a succeeding gas molecules. The Hq-gas molecule is of a diol type where only one of the hydroxyl groups can react with surface site due to steric hindrance. This will then leave a hydroxyl terminated surface for succeeding reactions with TMA.

This type of growth has also been exemplified by growth of films with the precursor combinations: TMA and malonic acid, TMA and terephtalic acid, $ZrCl_4$ and Hq, $TiCl_4$ and Hq, $TiCl_4$ and Ethylenediamine. The growth kinetics as derived from QCM data from these experiments are shown in FIG. F.

The two/or more types of functional groups on a gas molecule-need not be of the same type, but should in any way leave a reactive site suitable for succeeding growth with another type of gas molecules. Each type of gas molecules must not undergo reactions with itself.

With the method according to the invention the precursor for every monolayer can be selected freely among the compounds that will react with the available functional groups, and accordingly it is possible to generate films comprising alternating organic and inorganic moieties, where these moieties can be equal to or different from previously deposited moieties or they can be selected to form a optionally repeating pattern.

Some of the functional groups imagined to undergo reactions by the ALCVD principle are described in the following. For all the proposed reaction mechanisms, there is a possibility that the reaction scheme is somewhat shifted or different and the reaction schemes should not be interpreted limiting for the scope of the invention. The main principal is that the reaction results in a film being formed.

Concerning possible reactions between metal containing precursors and organic molecules with functional groups. Organic molecules with functional groups that have some degree of acidity, wiz, can donate a proton are preferred. This proton will be used to complete the alkane molecule or halogene acid molecule from the inorganic precursor and let the reaction proceed.

Below are presented some functional groups on the organic precursor that can be involved in the reactions, and examples on the reaction are given. All the suggested reactions are only illustrations of possible reactions and are not to be interpreted as limitations.

Hydroxyl Groups

Hydroxyl groups (R—OH) provide an oxygen and hydrogen for a possible reaction. These react readily with electropositive metals e.g. in the form of alkyls or halogenides, whereby a metal alkoxide and methyl or hydrohalogen acid is produced, respectively. This reaction is demonstrated for the production of Al-Hq and Al-Phl films by TMA and Hq or Phl.

The two partial reactions that take place between a diol (HO—R—OH) and TMA ((CH$_3$)$_3$Al) are given below:

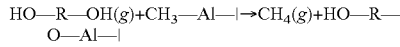

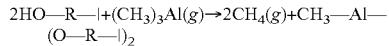

Electropositive metals known to readily undergo such reactions are: Al, Mg, Si, Ti, V and most probably several other metals like Zn, Mn, Fe, Co, Cr among others Ether Groups Ether groups (—OR) may react and form adducts to metals in the film. These bonds are rather weak, but still they may be a basis of structure formation for films produced at low temperatures. An example of such a reaction scheme is:

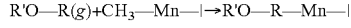

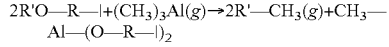

Only one half reaction is presented, because it is rather likely that film formed via this reaction path will use another type of functional group in its structure to form film in the next step. The general idea is to form chelating bonds between the ether and the metal atom.

Ketone Groups

Ketones (R=O) may react and form chelating bonds to a metal atom. One such example is the formation of compounds with β-ketones. An example of such visualized reaction scheme is:

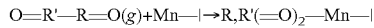

Only one half reaction is presented, because it is rather likely that film formed via this reaction path will use another type of functional group in its structure to form film in the next step. The general idea is to form chelating bonds between the ketone and the metal atom.

Carboxyl Groups

Carboxyl groups (—COOH) have the same building units as for hydroxyls (—OH) and ketones (=O), and should hence undergo the same reactions that these types show.

The two partial reactions that take place between a dicarboxylic acid (HOOC—R—COOH) and TMA ((CH$_3$)$_3$Al) are given below:

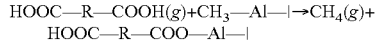

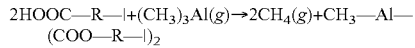

There is also a possibility for a different reaction scheme with TMA where it will react with both the =O and the —OH of a carboxyl acid.

Thiol Groups

Thiol groups (—SH) should react according to the same pattern as for their isoelectronic hydroxyl relatives (—OH). However, metal affinity towards sulphur is somewhat different than for oxygen. This results in that elements such as Pb, Au, Pt, Ag, Hg, and several more readily will react and form stable bonds towards sulphur.

The two partial reactions that take place between a di-thiol (HS—R—SH) and Pt(thd)$_2$ are given below:

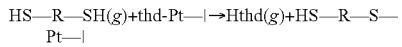

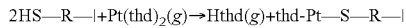

Sulphate Groups

Sulphate groups (—SO$_4$H) should react with electropositive metals according to the same reaction paths as for hydroxyls or ketones.

The two partial reactions that take place between a disulphate (HSO$_4$—R—SO$_4$H) and TMA ((CH$_3$)$_3$Al) are given below:

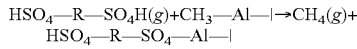

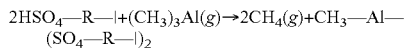

Sulphite Groups

Sulphite groups (—SO$_3$H) should react according to the same pattern as for sulphate groups.

The two partial reactions that take place between a disulphite (HSO$_3$—R—SO$_3$H) and TMA ((CH$_3$)$_3$Al) are given below:

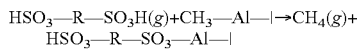

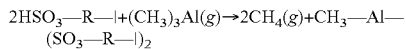

Phosphide Groups

The two partial reactions that take place between a di-phospide (H$_2$P—R—PH$_2$) and Ni(thd)$_2$, where thd stands for 2,2,6,6-tetramethyl-3,5-heptandione, are given below:

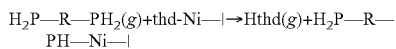

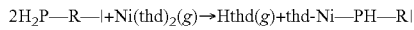

Phosphate Groups

The two partial reactions that take place between a diphosphate (HPO$_4$—R—PO$_4$H) and TMA ((CH$_3$)$_3$Al) are given below:

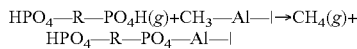

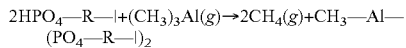

Amine Groups

Amine groups, alkyl amines, or silated amines, or halogenated amines, should react with compounds such as SnI$_2$, SnI$_4$, PbI$_2$, PbI$_4$, CuI$_2$, CuI$_4$ or similar to form perovskite related hybrid materials as described by D. B. Mitzi (D. B. Mitzi, Progress in Inorganic Chemistry, 48 (1999) 1-121. and D. B. Mitzi in Chemistry of Materials 13 (2001) 3283-3298.

One proposed reaction mechanism is:

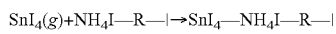

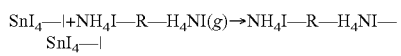

Further a redox-reaction with Sn(IV)-Sn(II) and formation of $I_2(g)$ might be involved here. The alternative, by using divalent halogenides may be visualized as:

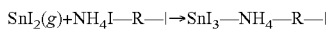

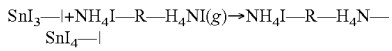

Another reaction mechanism with amines is the analogy of the hydroxides:

The two partial reactions that take place between a diamine ($H_2N$—R—$NH_2$) and TMA (($CH_3)_3Al$) are given below:

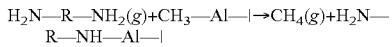

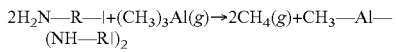

It is however likely that both H-atoms on one of the amines will react with TMA.

The following functional groups will react in a similar way: —OH, —SH, —SeH, —TeH, —$NH_2$, —$PH_2$, —$AsH_2$, —$SiH_3$, —$GeH_3$, —$SO_4H$, —$SO_3H$, —$PO_4H$, —$PO_3H$, $SeO_3H$, $SeO_4H$. In all cases where more than one H is present, the other H may be substituted by another organic group R, where R is straight and branched chain alkane, cycloalkane, an aryl group, a heteroaryl group or one of the other functional groups.

It should be emphasized that both functional groups of a precursor need not be of the same type. By using different functional groups with different reactivity there is a possibility to form a monolayer of organic molecules with a degree of ordering. This could also be combined by usage of different metal components that will have different affinities for the different groups.

The organic compound carrying the functional groups is not particularly limited but can be any organic molecule that can be brought into the gas phase. It is preferred that there is some steric hindrance in the molecule that will prevent it from reacting with both its reactive groups with the same surface, as there should be some active sites left for the subsequent reaction. Otherwise, there are no limitations to how the organic C—C structure looks. The organic molecule will of course influence the acidity of the protons on the functional groups. The organic compound may be a non-branched alkane, branched alkane, cyclo alkane, alkene, a monocyclic or polycyclic aromatic group, a heterocyclic aromatic group, where these compounds in addition to the functional groups can be substituted or not substituted with other organic groups like alkyl.

The inorganic precursors that can take part in the process according to the invention are described below. All the suggested reactions are only illustrations of possible reactions and are not to be interpreted as limitations.

Metal Alkyls

Metal alkyls and metal cycloalkyls are rather reactive and hence undergo reaction with most organic functional groups. This is exemplified by production of hybrid thin films by TMA and hydroxides. Examples of possible metal alkyls are: $Al(CH_3)_3$, $Zn(Et)_2$, $Zn(Me)_2$, $MgCp_2$;
where Cp stands for cyclopentyl.

Metal Halogenides

Some electropositive metal halogenides are rather reactive and undergo reaction with many organic functional groups. Some examples are $AlCl_3$, $TiCl_4$, $SiCl_4$, $SnCl_4$, $Si(CH_3)_2Cl_2$.

Metal Carbonyls

Metal carbonyls are also reactive, and some examples are: $Fe_2(CO)_9$, $Mn(CO)_x$ Metal Chelates Examples of reactive metal chelates are: $VO(thd)_2$, $Mn(HMDS)_2$, $Fe(HMDS)_2$, $TiO(thd)_2$, $Pt(thd)_2$.

Thd (=2,2,6,6-tetramethyl-3,5-heptandione) is a chelating compound from which compounds with elements as Ti, V, and several more can be made. HMDS stands for hexamethyldisilazane Other possible chelates are beta-ketones such as acetylacetonates, fluorinated thd-compounds and ethylenediaminetetra acetic acid (EDTA).

The metal for the inorganic precursor is selected from the group consisting of Al, Si, Ge, Sn, In, Pb, alkali metals, alkaline earth metals, 3d-insertion metals, 4d-insertion metals, 5d-insertion metals, lanthanides and actinides. Some of the more interesting metals are Cu, Ni, Co, Fe, Mn and V.

This invention is exemplified in the examples below, where trimethylaluminium (TMA), hydroquinone (Hq) and phloroglucinol (Phl) have been used as precursors to fabricate thin films of aluminium benzene oxides constructing a hybrid type of film. Films are produced by usage of TMA-Phl, TMA-Hq, and a controlled mixture of the type TMA-Phl-TMA-Hq. The growth kinetic is investigated on the basis of quarts crystal monitor (QCM) measurements and the films are analysed by Fourier transformed infrared spectroscopy (FT-IR) and by x-ray diffraction (XRD). The effect of air treatment on grown films has been noted.

The invention will be described in further detail with reference to the attached figures. The effect of pulse parameters on the growth rate was investigated at a reactor temperature of 200° C. by varying one of the parameters and keeping the others at a sufficiently high value.

The relative growth rate was measured with a QCM by using the slope of the measured resonant frequency over a 50 growth cycle period and normalizing it to growth per cycle. In this way the growth rate could be expressed in terms of $\Delta Hz$ $cycle^{-1}$, which is linearly proportional to a growth rat based on mass $cycle^{-1}$. The result of this investigation for both hydroquinone and phloroglucinol is shown in FIGS. A and B respectively. This shows that a self controlled growth can be obtained for properly chosen pulse parameters. The results indicate that the reaction of TMA with Phl terminated film occurs on two types of sites. The first type of sites is saturated at 0.2 s whereas a pulse length of 2 s is necessary in order to saturate the second type fully. According to QCM investigations of the pulse parameters (FIGS. A, and B) it is possible to grow hybrid films of TMA-Phl and TMA-Hq controlled with the ALCVD technique by using pulse parameters of 1.0 s for Phl and Hq pulse followed in both cases by a purge time of at least 0.5 s, and a pulse period of respectively 1.5, 0.5 s of TMA before a purge of 0.2 s for Phl and Hq containing films. The effect of temperature on the growth rate of TMA-Hq and on TMA-Phl films was measured by x-ray profilometry for films grown with 80 cycles at different reactor temperatures (FIG. C). The thickness measurement was done immediately after deposition and also on the same films after treatment in normal atmosphere for at least one week. This reveals that the films are somewhat air sensitive and alter the thickness with time; however, the thickness alteration is different for the two types of films. Films with Phl grow at a typical growth rate of 0.34 nm/cycle and reduce in thickness by 0.25 nm/cycle by air treatment, whereas films with Hq rather increase in thickness from 0.53 to 0.58 nm/cycle on air treatment. Nevertheless it shows that the growth rate is only minor affected by the growth temperature for both types of film, revealing an ALCVD window of 150-300 and 200-350° C. for Phl and Hq containing films, respectively. The linearity of growth was also tested by QCM measurements over a total of 1000 pulse cycles with the configuration 1.0-1.0-0.9-0.5 s for Hq/Phl pulse-purge-TMA pulse-purge (FIG. E). Both Phl and Hq containing films were found to have a linear thickness dependence on the number of pulse cycles, except for the initial stages of growth (up to ca. 30 pulses) where a reduced growth rate was found. This behaviour may stem from a limited amount of nucleation sites on the gold surface of the quarts, resonators, and preferential subsequent growth of the initial nuclei.

The result of IR analysis of films both as deposited and air treated for at least one week is shown in FIG. D together with IR analysis of pure hydroquinone and phloroglucinol pressed in KBr pellets. This reveals that there are distinct resemblances between the pure constituents and the films formed. There are in addition also some new bands formed that is believed to be due to the formation of the benzene oxides. The IR signals are somewhat altered when the films are air treated revealing that a chemical reaction is taking place. As for the Phl-Hq mixed films, it is possible to identify the pattern from both of the pure types of films. Attempts to measure the growth kinetics by using QCM, was done by measuring the growth pattern over 20 rather long cycles and then arithmetically average the result from all these cycles (FIG. F). FIG. F shows the growth of the following different hybrid thin films: (a) Al-Hq, (b) Al-Phl, (c) Al-malonic acid, Al-terephtalic acid, Zr-Hq, Ti-Hq, and (d) Ti-Ethylenediamine.

The most intuitively reaction mechanisms for these processes are presented in the equations below for Phl and Hq containing films respectively and give a relatively mass change that depends on the liberated methane stoichiometry for each pulse. The measured relative frequency changes were 3.5 and 1.9 respectively for Phl and Hq containing films. By solving the x parameters with basis in these values, a final methane stoichiometry of x=1.87 and 1.25 equates for Phl and Hq containing films respectively. This may however not be the total truth, since it may just as well be imagined that an excess of Phl and/or Hq may be introduced and leave unreacted HO—| in the film which is sterically hindered from full reaction with TMA. The apparent two sectioned shape of the dependence of the growth rate on the TMA pulse time, may indicate that the last case of sterically hindered HO—| groups, is the most likely case in these situations. XRD analysis of the films proved that neither of the films was well oriented. The as grown films with Phl gave no diffraction pattern whereas the as grown films with Hq had one diffraction peak at 2θ=23.0°. For air treated films a diffraction peak at 2θ=27.5° appeared on films with Phl. For the same type of treated films with Hq, a minor peak at 2θ=18.50 appeared. Rocking curve analysis of peaks on as grown films with Phl and for the peaks on both of the aired films proved that they all were fully randomly oriented. This was also observed for films with both Phl and Hq, as shown in FIG. G. The XRD analysis of these films resembles those with only Phl.

IR analysis has been performed on a selection of the exemplified growth systems and a table of the characteristic absorption bands or peaks are given in the table A. It should be taken into consideration that some of these films have undergone reactions with the air while performing the IR measurements.

TABLE A

Characteristic IR absorption bands or peaks for deposited hybrid films.

| Inorganic precursor | Organic precursor | Absorption bands/cm$^{-1}$ |
|---|---|---|
| TMA | Hq | 1507, 1223, 879, 834, 800 |
| TMA | Phl | 1619, 1516, 1433, 1381, 1247, 1218, 1173, 1020, 946, 905, 845, 668, 574 |
| TMA | Terephtalic acid | 1596, 1509, 1415, 1312, 1251, 1160, 1103, 879, 812, 755, 573 |
| TMA | Malonic acid | 1620, 1485, 1438, 1376, 1280, 1235, 1180, 1074, 1003, 965, 812, 738, 522 |
| TiCl$_4$ | Hq | 1487, 1198, 886, 832, 817 |
| ZrCl$_4$ | Hq | 1497, 1272, 1203, 884, 832, 804 |

We have shown the possibility of growth of films with a hybrid type by the ALCVD technique by growing films with a network of aluminium benzene oxides with hydroquinone and phloroglucinol. We have made films with aluminium benzene oxides with pure hydroquinone or phloroglucinol and films where these are mixed. Overall we have so far also shown the possibility of growth of hybrid type films by the ALCVD technique using precursor pairs as:

TMA—Hq, thus proving growth of Al and also growth of an aromatic diol.
TMA—Phl, thus proving growth of also an aromatic triol.
TMA—Malonic acid, thus proving growth with a linear di-carboxcylic acid.
TMA—Terephtalic acid, thus proving growth with an aromatic di-carboxcylic acid.
TiCl$_4$—Hq, thus proving growth with titanium.
ZrCl$_4$—Hq, thus proving growth with zirconium.
TiCl$_4$—Ethylenediamine, thus proving growth of an amine.
Reaction Equations:
Principal Reaction Mechanism:
Phl-Case:

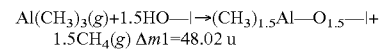

$$Al(CH_3)_3(g)+1.5HO-|\rightarrow(CH_3)_{1.5}Al-O_{1.5}-|+1.5CH_4(g) \;\Delta m1=48.02\,u$$

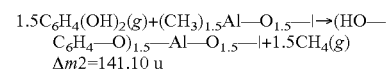

$$1.5C_6H_4(OH)_2(g)+(CH_3)_{1.5}Al-O_{1.5}-|\rightarrow(HO-C_6H_4-O)_{1.5}-Al-O_{1.5}-|+1.5CH_4(g)$$
$$\Delta m2=141.10\,u$$

$$\Delta m2/\Delta m1=2.94$$

The mass difference is smaller than measured by QCM and the mechanism should be modified to allow for less unreacted OH groups during the first step.
Hq-Case:

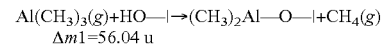

$$Al(CH_3)_3(g)+HO-|\rightarrow(CH_3)_2Al-O-|+CH_4(g)$$
$$\Delta m1=56.04\,u$$

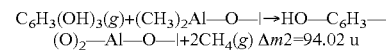

$$C_6H_3(OH)_3(g)+(CH_3)_2Al-O-|\rightarrow HO-C_6H_3-(O)_2-Al-O-|+2CH_4(g) \;\Delta m2=94.02\,u$$

$$\Delta m2/\Delta m1=1.68$$

The mass difference is smaller than measured by QCM and the mechanism should be modified to allow for less unreacted OH groups during the first step.
Reaction mechanism with varying degree of reactivity of OH-groups:
Phl-Case:

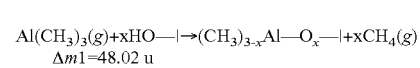

$$Al(CH_3)_3(g)+xHO-|\rightarrow(CH_3)_{3-x}Al-O_x-|+xCH_4(g)$$
$$\Delta m1=48.02\,u$$

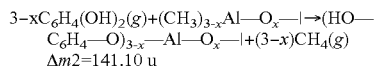
$\Delta m2 = 141.10\ u$ $x = 1.87$

HQ-Case:

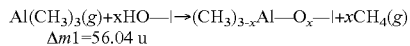
$\Delta m1 = 56.04\ u$

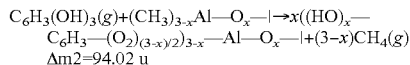
$\Delta m2 = 94.02\ u$ $x = 1.25$

Reaction mechanism with fixed degree of reactivity of OH-groups according to observations by QCM:

Phl-Case:

$Al(CH_3)_3(g) + 1.87 HO\text{—}|\rightarrow (CH_3)_{1.13}Al\text{—}O_{1.87}\text{—}| + 1.87 CH_4(g)$ $\Delta m1 = 42.08\ u$

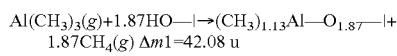
$\Delta m2 = 147.03\ u$ $\Delta m2/\Delta m1 = 3.5$

Hq-Case:

$Al(CH_3)_3(g) + 1.25 HO\text{—}|\rightarrow (CH_3)_{1.75}Al\text{—}O_{1.25}\text{—}| + 1.25 CH_4(g)$ $\Delta m1 = 52.03\ u$

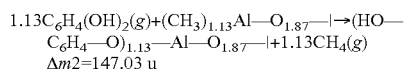
$\Delta m2 = 98.03\ u$ $\Delta m2/\Delta m1 = 1.9$

The principle function of this invention is a technique/method or procedure one uses to deposit film of an organic-inorganic nature. The film is produced by a gas phase deposition technique exploiting self hindered surface reactions with individual gas phase precursors. The precursors are pulsed sequentially, each followed by a purge with an inert gas, to avoid gas phase reactions. The procedure has previously been used for pure inorganic materials and is called such names as ALCVD (Atomic Layer Chemical Vapour Deposition, or ALE=Atomic Layer Epitaxy, or ALD=Atomic Layer Deposition).

The invention may be used to produce a type of organic-inorganic material that is built by chemical reactions. The physical properties of the materials are not of importance in this invention, but rather the procedure of production of such materials. Hence, all types of materials constructed of organic blocks and inorganic blocks with the ALCVD (ALD, ALE) method or similar methods should be within the scope of this invention.

Related methods that are mainly sold as CVD methods, but in principle are relatives of ALCVD should also be included. In this aspect all methods where one utilizes the ideology to separate the introduction of different precursors onto the substrates should be included. This may be performed by either moving the substrates between different precursor zones, or moving the precursor lines over the different substrates, or a mixture of both.

The films have been deposited using a F-120 Sat (ASM Mirochemistry) reactor by using trimethylaluminium, hereafter termed TMA, (Crompton, technical quality), hydroquinone(1,4-dihydroxybenzene, hereafter referred to as Hq) (BDH Laboratory Supplies, >99%) and/or phloroglucinol (1,3,5-trihydroxybenzene, hereafter referred to as Phl) (Merck, >99%) as precursors. The temperature of the TMA precursor was held at 20° C. during film growth whereas hydroquinone and phloroglucinol was sublimed at 140° C. and 175° C. respectively.

Nitrogen was produced in house using a Schimidlin Nitrox 3001 generator (99.999% as to $N_2 + Ar$) and used as purging and carrier gas. The pressure of the reactor during growth was maintained at 1.8 mbar by employing an inert gas flow of 300 $cm^3\ min^{-1}$.

The pulse and purge parameters of the film growth was investigated by using a quarts crystal monitor (QCM), by using two 5 MHz gold or silver coated crystal sensors and a Matex MT-400 crystal monitor connected to a computer. This constellation made it possible to sample two sensors at the same time with a 10 Hz recording rate.

A Siemens D5000 diffractometer in θ-θ mode, equipped with a göbel mirror producing parallel Cu Kα radiation, was used for x-ray profilometry thickness measurements and for conventional x-ray diffraction analysis.

IR analysis was performed on films deposited on both sides of double polished Si(100) substrates and using a blank Si(100) substrate as reference. A Perkin Elmer FT-IR System 2000 was used for this purpose.

The films were deposited on soda lime and Si(100) substrates by sequentially pulsing of TMA and either hydroquinone or phloroglucinol. Films were also made where the organic pulses was alternately switched between hydroquinone and phloroglucinol in an Al—O-Hq-Al—O-Phl manner.

The substrate material is not limited to the type of materials used here but can be any material reactive towards at least on of the precursors.

Applications for Hybrid Thin Films.

Hybrid materials may have applications in almost every type of area possibly imagined. Its limits in applications may rather be imagined by the limitations of the films themselves. Since one of the constituents in these films is of organic material, including here biomolecules, the thermal stability of these films will be limited by the stability of these constituents. Another effect which on first sight may be envisioned as a limitation is the hybrid material stability towards natural atmosphere or in fact outer chemical environments. This is today being dealt with in the production of organic light emitting devices, which also have these severe limitations towards water and oxygen exposure. This can however also be brought to its advantage if one consider the materials as sensors towards such exposures.

Some of the areas where hybrid thin films may come into application are:

Optical Materials

Probably the first application of thin films in general was as an optical material. By application of thin films with thickness in the order of the wave length in interest, one will alter the optical properties of the material. This approach is used in production of anti-reflective coatings. In the same way, reflective coatings can also be produced. More sophisticated wave-length filters can be produced by alternately depositing materials with high and low index of refraction.

The ALCVD technique has only sporadically been demonstrated as usable for production of optical materials, even though it should show a superior ability to produce sharp interfaces. One reason is the slowness of the ALCVD process in comparison with other long used techniques. This picture may not necessary be true for hybrid types of thin films, since the units that are deposited are much larger in size, as compared for pure inorganic films. For comparison, the deposition of ca. 50 nm of a Al-Phl type hybrid film only involved some 80 pulse sequences, and unoptimized had a growth rate of ca. 0.18 nm/s=0.64 μm/h. This can be further increased by usage of larger types organic molecules than phluroglucinol.

The index of refraction of the different layers of hybrid materials can be changed by varying the types of materials used. Hybrid materials can also be used together with sections of purely inorganic layers to increase the versatility.

In this way, films that show properties such as: anti reflection, enhanced reflection, cut-on or cut-off filters, narrow band or wide band filters can be made.

The types of organic or inorganic materials used can be changed at the resolution of one monolayer. This will enable one to use several different types of material during one film deposition ran. This can produce films that appear as graded films with respect to alterations in the index of refraction or other physical properties. Such materials are of high interest in thin film optics since a higher figure of merit can be reached.

Optical films can be used for other types of application than imaging if it is possible to influence the optical properties one way or the other. Approaches imaginable are:
  To influence the thickness of the individual layers of the thin films.
  To alter the index of refraction by altering the chemistry of the material.

Hybrid materials are a class of materials that is very susceptible to influences that may alter the thickness, index of refraction or both. The reason for this is their softness and open structure, together with the inorganic materials. This makes the materials ideal as sensor materials with outcome in alterations of optical effects, e.g. alteration of color.

Applications that utilize these effects will be described below.

Optical Hybrid Materials as Pressure Sensors

One immediate effect of constricting an optical multilayer wavelength filter by materials that are regarded to be soft is that the optical effect is pressure sensitive. By applying pressure to the film stack, the physical thickness will be somewhat altered, which again will influence the optical properties, e.g. alter the #wavelength of transmitted light for the wavelength filter.

Optical Hybrid Materials as Gas Sensors

Hybrid materials have a crystal structure that is dependant on the packing efficiency of the organic molecules in the structure. The forces between these molecules are often of a van der Waals character, and hence not too strong. This implies that the size of the crystal unit lattice is susceptible towards external effects like gas molecules adsorbing between these organic molecules. If an optical thin film material is constructed of such a material, then gas adsorption will be manifested by a change in the physical thickness, and again, an alteration of the optical properties in the same way as mentioned for pressure sensors.

It should be possible to construct materials with organic molecules that are more susceptible towards some kinds of gas molecules than others and hence work as selective gas sensors.

The effect of alteration of physical thickness with an external gas is already demonstrated by air treatment of Al-Hq and Al-Phl films. It is interesting in this respect to note that the thickness alteration with exposure to normal air resulted in an increase in thickness for Al-Phl and decrease in thickness for Al-Hq case. Hence by combining different types of hybrid materials, many interesting optical effects can be made.

Optical Hybrid Materials as Temperature Sensors

The physical thickness of materials will be affected by the temperature, especially when van der Waals interactions take part in the structure, or the structure consists of longer chains, such as is the case for many types of hybrid materials. This will again manifest itself in alterations of the optical properties of optical thin films, and thus function as temperature sensors.

Optical Hybrid Materials as Magnetic Field Sensors

The ability to combine both organic and inorganic materials gives rise to numerous possibilities. One such possibility is to use magnetically active inorganic material for construction of the hybrid materials. These inorganic parts may interact with external magnetic fields and hence give rise to alterations of the thickness of the material. This will again alter the optical properties of optical thin films constructed of such materials. The hybrid materials may be given enhanced properties by depositing these under the influence of a relatively large magnetic field during construction.

There are several possibilities to find effects that will result in a change in thickness. One, not so obvious, is if there are aromatic rings present in the organic molecules. A magnetic field will induce currents in these ring structures which again will induce a magnetic field. The result is that these structures will have a driving force to align themselves in a magnetic field. The magnitude of this force will be greater for larger structures of aromatic rings.

The more obvious effect is if there are metal elements with unpaired spins. These spins will be affected by the external magnetic field. This can induce rotation of the metal polyhedra in the structure, which again will affect the thickness. If some of these metal atoms adopt a long range order, then structures that are ferromagnetic of anti-ferromagnetic may occur. These will in total be influenced by an external field in a larger magnitude than mentioned above. Whole layers of the film structure may feel contractive or repulsive forces to the magnetic field, depending on the orientations of the internal magnetic field. This could in fact result in structures where alternative layers in the film structure contracted and repulsed. This would be an extremely interesting structure from a theoretical point of view.

Optical Hybrid Materials as Electric Field Sensors

Electric fields will induce forces on dipolar molecules. If a hybrid material is constructed with such molecules as one of the building units, then the physical thickness may be influenced by external electric fields. Hence, the material will show piezoelectric effects. It is of importance that there is an excess of dipolar molecules with one particular orientation in the hybrid material, so that it produces on overall an electrical polarization. This can be enhanced by depositing these films under electrical fields.

Electrical Properties

The sensor effects of hybrid materials have been exemplified above on the basis of an optical construction, however, generally for all materials; an alteration of physical size of a material should also influence the electrical properties. This should be measurable as an alteration of the resistance of the thin film, or other electrical effects, and hence also usable for sensor readout. It has been proven possible to construct hybrid materials with varying degrees of electrical band gaps (D. B. Mitzi, Progress in Inorganic Chemistry, 48 (1999) 1-121. and D. B. Mitzi in Chemistry of Materials 13 (2001) 3283-3298). The magnitude of these band gaps should be influenced by the physical thickness of the films and hence give rise to electrically measurable effects.

With basis in these effects it should be possible to produce materials that show pyroelectricity as well.

The possibility to produce materials that show piezoelectricity also enables the production of actuators and resonators.

If the properties mentioned above are stabilized in one or more of the influenced states. This will then produce materials that may be ferroelectric, ferromagnetic, and sub-groups of these phenomena.

Hybrid materials can be constructed with varying degree of electrical isolation, depending on both the organic and inorganic molecules used. It should be possible to construct materials that show conduction within the layers, but not normal to the layers. This is typical for layered structures. In the same way it may be possible to construct the opposite case by producing one-dimensional structures of hybrid materials.

Insulating materials should be constructed from organic molecules without aromaticity, and with only singular carbon bonds, and from inorganic elements in their highest oxidation state. Both requirements does not necessary have to be met at the same time since have already demonstrated that Al-Hq and Al-Phl films are insulating even though they contain aromatic organic molecules.

By introducing metallic elements in a lower oxidation state than their highest one, or by constructions of long range aromatic bonds, it should be possible to introduce both semi-conduction (p- and n-type) and metallic conductivity.

It is also envisioned that by introduction of elements such as Nb or Hg, the materials may also be rendered superconducting at low temperatures. It should also be possible to make HTc materials by depositing sections of such materials in between layers of purely hybrid nature. The stack should still be considered as a hybrid material.

Hybrid thin films are today being used as electroluminescent materials in organic light emitting diodes. We should aim at producing materials that show such properties with this technique. One such candidate would be to use TMA and quinoline.

Other types of optically active materials that should be sought for are photovoltaic materials. This is in principle the reverse of electroluminescent materials and should be connected to this field.

Light harvesting materials are typically also of a hybrid nature and can be used as wavelength shift materials. An example is filters converting UV light to visible or near IR light.

Other fields that generally affect the same areas are: Photoionics, non linear optics, chromophore materials, and further.

The summation of these effects is that hybrid films may be applied to almost any type of area, from flat panel displays and smart windows to information storage, actuators, and sensors.

We have demonstrated that films of Al-Hq and Al-Phl change their physical thickness upon air treatment, and thus proved that these materials are potential sensor materials where the physical thickness is monitored by some means.

The invention claimed is:

1. A process for preparation of a thin film of an organic-inorganic nature on a substrate by an atomic layer deposition (ALD) technique comprising the following steps:
   a) contacting the substrate with a pulse of an inorganic precursor selected from the group consisting of metal alkyls, metal cycloalkyls, metal aryls, metal amine, metal silylamine, metal halogenides, metal carbonyls and metal chelates, where the metal is selected from the group consisting of Al, Si, Ge, Sn, In, Pb, alkali metals, alkaline earth metals, 3d-insertion metals, 4d-insertion metals, 5d-insertion metals, lanthanides and actinides;
   b) reacting the inorganic precursor with at least one surface of the substrate;
   c) removing non-reacted inorganic precursor and reaction by-products if any;
   d) contacting the surface of said substrate with a pulse of an organic precursor; where the organic precursor is an organic compound with at least two reactive substituents selected from the group consisting of —OH, —OR, =O, —COOH, —SH, —$SO_4H$, —$SO_3H$, —$PH_2$, —$PO_4H$, —$PO_3H$, —PRH, —$NH_2$, —$NH_3I$, —SeH, —$SeO_3H$, —$SeO_4H$, —TeH, —$AsH_2$, —AsRH, —$SiH_3$, —$SiRH_2$, —SiRR'H, —$GeH_3$, —$GeRH_2$, —GeRR'H, amine, alkyl amine, silated amine, halogenated amine, imide, azide and nitroxyl, wherein the group R and R' are independently selected among a C1-10 aryl, alkyl, cycloalkyl, alkenyl or alkynyl group, where the organic compound is selected among straight or branched alkanes, cyclo alkanes, alkenes, mono- and poly-cyclic aromatic groups, heterocyclic aromatic groups, where the organic compound optionally may comprise other substituents than the at least two reactive substituents, and where the organic precursor can be brought into gas phase;
   e) reacting the organic precursor with the inorganic compound bound to the substrate to form an organic inorganic hybrid layer;
   f) removing non-reacted organic precursor and reaction by-products if any;
   g) repeating step a) to f) until the wanted film thickness is achieved.

2. Process according to claim 1, wherein steps a) to c) are repeated one or more times before the steps d) to f) are performed.

3. Process according to claim 1 wherein the process further comprises performing the steps d) and f) one or more times before the steps a) to g) are performed.

4. Process according to claim 1, wherein the metal in the inorganic precursor is an electro positive metal and that the organic precursor is an organic compound selected from the group consisting of straight and branched chain alkanes, cycloalkanes, aryl groups and heteroaryl groups, where the organic compound is substituted with at least two substituents selected from the group consisting of —OH, —OR, =O, —COOH, —SH, —$SO_4H$, —$SO_3H$, —$PH_2$, —$PO_4H$, —$PO_3H$, —PRH, —$NH_2$, —$NH_3I$, —SeH, —$SeO_3H$, —$SeO_4H$, —TeH, —$AsH_2$, —AsRH, —$SiH_3$, —$SiRH_2$, —SiRR'H, —$GeH_3$, —$GeRH_2$, —GeRRH, amine, alkyl amine, silated amine, halogenated amine, imide, azide and nitroxyl.

5. The process according to claim 1, wherein the organic precursor comprises from 2 to 6 substituents selected from the group consisting of —OH, —OR, =O, —COOH, —SH, —$SO_4H$, —$SO_3H$, —$PH_2$, —$PO_4H$, —$PO_3H$, —PRH, —$NH_2$, —$NH_3I$, —SeH, —$SeO_3H$, —$SeO_4H$, —TeH, —$AsH_2$, —AsRH, —$SiH_3$, —$SiRH_2$, —SiRR'H, —$GeH_3$, —$GeRH_2$, —GeRR'H, amine, alkyl amine, silated amine, halogenated amine, imide, azide and nitroxyl.

6. The process according to claim 1, wherein the removal of non-reacted precursors and by-products in step c) and f) is performed by purging with an inert gas.

7. The process according to claim 1, wherein the substrate comprises a monolayer of an organic precursor according to claim 1 bound to the surface, before step a) is performed for the first time.

8. The process according to claim 1, wherein the pulse in step a) has a duration of 0.1 to 5 s.

9. The process according to claim 4, wherein the purging in steps c) and f) has a duration of 0.1 to 5 s.

10. The process according to claim 1, wherein the pulse of the organic precursor has a duration of 0.1 to 5 s.

11. The process according to claim 1, wherein the inorganic precursor comprises an electropositive metal, and the organic precursor is an organic compound substituted with 2-6 substituents selected from the group consisting of —OH, —COOH, —SH, —SO$_4$H, —SO$_3$H, —PO$_4$H, —NH$_2$, and —NH$_3$I.

12. The process according to claim 11, wherein the organic precursor is benzene substituted with 2-6, hydroxyl groups.

13. The process according to claim 11, wherein the thin film comprises monolayers of benzene aluminium oxide.

14. The process according to claim 1, wherein the inorganic precursor comprises a metal selected from the group consisting of Pb, Au, Pt, Ag and Hg and the organic precursor is an organic compound substituted with 2-6 —SH groups.

15. The process according to claim 1, wherein the inorganic precursor is a metal halogenides comprises a metal selected from the group consisting of Pb, Zn and Cu and the organic precursor is an organic compound substituted with 2-6 substituents selected from the group consisting of amine, alkyl amine, silated amine, and halogenated amine.

16. The process according to claim 6, wherein the purging is performed with nitrogen.

17. The process according to claim 8, wherein the duration of the pulse is 0.2 to 2 s.

18. The process according to claim 9, wherein the purging has a duration of 0.2 to 2 s.

19. The process according to claim 9, wherein the purging has a duration of 0.5 s.

20. The process according to claim 10, wherein the duration of the pulse is 0.2 to 2 s.

21. The process according to claim 11, wherein the organic precursor is an organic compound substituted with 2-3 substituents.

22. The process according to claim 12, wherein the benzene is substituted with 2-3 hydroxyl groups.

23. The process according to claim 11, wherein the electropositive metal is selected from the group consisting of Al, Si, Sn, Zn, Mg, Ti, V, Mn, Fe, Co, Cr and Pt.

24. The process according to claim 6, wherein the inert gas is nitrogen.

\* \* \* \* \*